(12) United States Patent
Kikuchi

(10) Patent No.: US 6,211,925 B1
(45) Date of Patent: Apr. 3, 2001

(54) VIDEO INTERMEDIATE-FREQUENCY SIGNAL PROCESSING DEVICE CAPABLE OF RECEIVING FM BROADCASTS

(75) Inventor: Kazuyuki Kikuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/195,234

(22) Filed: Nov. 18, 1998

(30) Foreign Application Priority Data

Jun. 15, 1998 (JP) .................................................. 10-167496

(51) Int. Cl.$^7$ ...................................................... H04N 5/46
(52) U.S. Cl. ........................ 348/729; 348/737; 455/188.1
(58) Field of Search .................................. 348/729, 736, 348/737, 738, 731, 725; 455/179.1, 180.1, 180.4, 188.1, 188.2, 189.1

(56) References Cited

U.S. PATENT DOCUMENTS

| | | | | |
|---|---|---|---|---|
| 4,139,866 | * | 2/1979 | Wegner | 348/738 |
| 4,272,788 | * | 6/1981 | Ogita | 348/738 |
| 4,353,093 | * | 10/1982 | Durbin, Jr. et al. | 348/737 |
| 4,514,763 | * | 4/1985 | Rindal | 348/738 |
| 5,710,993 | * | 1/1998 | Brekelmans | 455/188.1 |
| 6,008,693 | * | 12/1999 | Heinke | 348/738 |
| 6,044,251 | * | 3/2000 | Brekelmans | 455/189.1 |

FOREIGN PATENT DOCUMENTS 7162771  6/1995  (JP) .
9512408  12/1997  (JP) .

* cited by examiner

*Primary Examiner*—John K. Peng
*Assistant Examiner*—Trang U. Tran
(74) *Attorney, Agent, or Firm*—Leydig, Voit & Mayer, Ltd.

(57) ABSTRACT

A video intermediate-frequency signal processing device capable of receiving FM broadcasts, includes a first FM detecting unit for demodulating an intermediate-frequency signal from a sound intermediate-frequency detecting unit using a phase-locked loop, and for furnishing a demodulated FM signal, a second FM detecting unit for detecting or demodulating a reference signal applied to generate a reference DC voltage, a comparator for obtaining a difference between the modulated FM signal from the first FM detecting unit and the reference DC voltage from the second FM detecting unit, and for furnishing, as a sound signal, a signal having a value corresponding to the difference, and a feedback unit for, when receiving FM broadcasts, filtering the output of the comparator, and feeding the filtered output back to a low-pass filter of a phase-locked loop included in a video detecting unit.

3 Claims, 2 Drawing Sheets

VIDEO INTERMEDIATE-FREQUENCY SIGNAL PROCESSING DEVICE CAPABLE OF RECEIVING FM BROADCASTS

BACKGROUND OF THE INVENTION

1. Field of the Invention

The present invention relates to a intermediate-frequency signal processing device, which can be incorporated into television receivers, VTRs, or the like, for receiving FM broadcasts as well as television broadcasts.

2. Description of the Prior Art

Recent years have seen an increase in television receivers capable of receiving general FM broadcasts, such as portable color televisions, and liquid crystal televisions. Referring now to FIG. 2, there is illustrated a block diagram showing the structure of an example of a prior art video intermediate-frequency signal processing device which can be incorporated into such television receivers. In the figure, reference numeral 1 denotes an antenna for receiving broadcast waves, and 2 denotes a tuner which can select a desired broadcast wave from among the plurality of broadcast waves received via the antenna 1, and which, when receiving television broadcast waves, can convert a selected television broadcast signal into an intermediate-frequency signal including a video modulated component and a sound modulated component, and, when receiving FM broadcast waves, can convert a selected FM broadcast signal into an intermediate-frequency signal having the same frequency as the sound intermediate-frequency component generated when receiving television broadcast waves. Furthermore, reference numeral 3 denotes a video intermediate-frequency surface acoustic filter, which is hereafter abbreviated as a VIF SAW filter, for extracting a video intermediate-frequency component of a certain frequency, for example 58.75 MHz, in the case where the television receiver is destined for Japan, from the output of the tuner 2, 6 denotes a sound intermediate-frequency SAW filter, which is hereafter abbreviated as an SIF SAW filter, for extracting a sound intermediate-frequency component of a certain frequency, for example 54.25 MHz, in the case where the television receiver is destined for Japan, from the output of the tuner 2, and 4 denotes a video intermediate-frequency signal processing IC for detecting or demodulating the output of the VIF SAW filter 3. In addition, reference numeral 12 denotes a VIF amplifier for amplifying the output of the VIF SAW filter 3, 13 denotes a video detector for demodulating the output of the VIF amplifier 12, 14 denotes an intermediate-frequency automatic gain control circuit, which is hereafter abbreviated as an IF AGC circuit, for controlling the gain of the VIF amplifier 12 according to the output of the video detector 13, 15 denotes an IF AGC filter terminal for connecting an IF AGC filter 16, comprised of a capacitor, to the IF AGC circuit 14, 31 denotes a switch which can be switched to a TV terminal so as to open both ends of IF AGC filter 16 when receiving television broadcast waves, and which can be switched to an FM terminal so as to close both ends of the IF AGC filter 16 when receiving FM broadcast waves, and 17 denotes an automatic phase control detector, which is hereafter abbreviated as an APC detector, for comparing the phase of an output signal from the VIF amplifier 12 and that of an output signal from a voltage-controlled oscillator or VCO 18 so as to furnish a signal indicating the phase difference between them to the VCO 18 and perform an automatic phase control operation on the VCO 18. The VCO 18 furnishes a control voltage of a certain frequency, dependent on the output of the APC detector 17, to both the video detector 13 and the APC detector 17. In addition, reference numeral 19 denotes a VCO coil for setting the free-running frequency of the VCO 18 to 58.75 MHz. The VCO coil 19 includes an inductance component and a capacitance component. Reference numeral 20 denotes an APC filter terminal for connecting an APC filter 21 to the APC detector 17. The APC filter 21 is comprised of a capacitor and a resistor. After the APC filter 21 filters the output of the APC detector 17, the output of the APC detector 17 is applied as a control input to the VCO 18.

Reference numeral 23 denotes a sound intermediate frequency detector for receiving both the output of the SIF SAW filter 6 and the output of the VCO 18, and for an SIF detection, 24 denotes an FM detector for performing an FM detection on the output of the SIF detector 23, and 25 denotes an FM detection coil terminal for connecting an FM detection coil 26 to the FM detector 24. The FM detection coil 26 is connected between the FM detection coil terminal 25 and a ground potential, and includes an inductance component and a capacitance component. Furthermore, reference numeral 27 denotes an output terminal through which a detected sound (or voice) output from the FM detector 24 is furnished, 28 denotes a low-pass filter comprised of a resistor and a capacitor, for extracting low-frequency components from the detected sound output from the FM detector 24, and 30 denotes a switch which can be switched to a TV terminal so as to disconnect the output of the low-pass filter 28 from the APC filter terminal 20 when receiving television broadcast waves, and which can be switched to an FM terminal so as to connect the output of the low-pass filter 28 to the APC filter terminal 20 when receiving FM broadcast waves.

Next, a description will be made as to the operation of the prior art video intermediate-frequency signal processing device. When receiving a television broadcast, the video detector 13 demodulates the video intermediate-frequency signal which has been amplified by the VIF amplifier 12 so that the video intermediate-frequency signal has a certain amplitude. The video detector 13 then furnishes the demodulated video signal by way of the output terminal 5. Since the switch 31 does not short circuit the IF AGC filter 16, the IF AGC circuit 14 produces an AGC voltage from the demodulated video output of the video detector 13, and the IF AGC filter 16 then filters the AGC voltage from the IF AGC circuit 14. The filtered AGC voltage is applied to the VIF amplifier 12. Thus, the IF AGC loop is formed when receiving a television broadcast. The phase-locked loop or PLL comprised of the APC detector 17, the APC filter 21, and the VCO 18 generates a reference carrier wave used for demodulating the video intermediate-frequency signal from the VIF SAW filter. The reference carrier wave furnished by the VCO 18 has the same frequency as the VIF carrier wave, and is in phase with the VIF carrier wave.

For a sound signal in the received television broadcast wave, the SIF detector 23 performs a detection by multiplying the reference carrier wave from the VCO 18 by a sound intermediate-frequency signal extracted by the SIF SAW filter 6 (e.g. a sound signal at a frequency of 54.25 MHz in the case where the video intermediate-frequency signal processing device is destined for Japan), so as to convert the sound intermediate-frequency signal into an intermediate-frequency signal at a frequency of, for example, 4.5 MHz. After that, the FM detector 24 demodulates the intermediate-frequency signal to produce a sound signal and then furnishes it by way of the output terminal 27. At that time, since the switch 30 is switched to the TV terminal, the demodulated sound signal filtered by the low-pass filter 28 does not reach the APC filter 21.

On the other hand, when receiving an FM broadcast, the switch 31 is switched to the FM terminal and shorts circuits the IF AGC filter 16. As a result, the gain of the VIF amplifier 12 is reduced to a minimum. Since the APC detector 17 does not output anything when the gain of the VIF amplifier 12 is set to its minimum, the VCO 18 oscillates freely while it is unaffected by the APC detector 17. The other switch 30 is then switched to the FM terminal and the DC voltage that appears at the output terminal 27 therefore enters the low-pass filter 28. The low-pass filter 28 then rejects a sound signal from the DC voltage and then furnishes the filtered DC voltage to the APC filter terminal 20 by way of the switch 30. If automatic fine tuning or AFT is carried out so that the polarity of the FM detection characteristics matches the polarity of the AFT, the VCO 18 can be stably controlled and therefore the FM detection can be performed. Thus, by using the same circuit as that used when demodulating a modulated sound signal included in a television broadcast wave, the prior art video intermediate-frequency signal processing device can convert an FM broadcast signal into an intermediate-frequency signal at a frequency of 54.25 MHz by means of the tuner 2, further convert the intermediate-frequency signal into anther intermediate-frequency signal whose carrier frequency is 4.5 MHz by means of the SIF detector 23, and then produce an FM broadcast sound signal.

A problem with the prior art intermediate-frequency signal processing device capable of receiving FM broadcasts is that the cost of manufacturing is increased because it needs the FM detection coil 26 and the FM detection coil terminal 25 for connecting the coil to the FM detector 24 to control the VCO 18 stably when receiving an FM broadcast, and the FM detection coil 26 needs to be adjusted so that the frequency characteristic of the output voltage of the APC detector 17 that appears at the APC filter terminal 20 is symmetric with respect the intermediate frequency of 4.5 MHz.

SUMMARY OF THE INVENTION

The present invention is made to overcome the above problem. It is therefore an object of the present invention to provide a low-cost video intermediate-frequency signal processing device capable of receiving FM broadcasts without having to use an FM detection coil and a terminal for connecting the coil to an FM detector, and hence without having to adjust the FM detection coil at the time of manufacture.

In accordance with the present invention, there is provided a video intermediate-frequency signal processing device comprising: a tuner for selecting an FM or TV broadcast wave from among FM or TV broadcast waves, for, when receiving TV broadcasts, converting a selected television broadcast signal into an intermediate-frequency signal including a video component and a sound component, and, when receiving FM broadcasts, converting a selected FM broadcast signal into an intermediate-frequency signal having the same frequency as the sound component to be generated when receiving TV broadcasts, and for furnishing the intermediate-frequency signal; a first extracting unit for extracting a video intermediate-frequency signal associated with the selected TV broadcast wave from the output of the tuner; a second extracting unit for extracting either a sound intermediate-frequency signal associated with the selected TV broadcast wave or an intermediate-frequency signal associated with the selected FM broadcast wave from the output of the tuner; a video detecting unit for demodulating the video intermediate-frequency signal extracted by the first extracting unit using a phase-locked loop including a voltage-controlled oscillator that can oscillate freely at the same frequency as the video intermediate-frequency signal; a sound intermediate-frequency detecting unit for converting the sound intermediate-frequency signal associated with the selected TV broadcast wave or the intermediate-frequency signal associated with the selected FM broadcast wave, which is extracted by the second extracting unit, into another intermediate-frequency signal of a lower frequency using an output of the voltage-controlled oscillator; a first FM detecting unit for demodulating the other intermediate-frequency signal from the sound intermediate-frequency detecting unit using a phase-locked loop, and for furnishing a demodulated FM signal; a second FM detecting unit for detecting or demodulating a reference signal applied thereto so as to generate a reference DC voltage; a comparator for obtaining a difference between the modulated FM signal from the first FM detecting unit and the reference DC voltage from the second FM detecting unit, and for furnishing, as a sound signal, a signal having a value corresponding to the difference; and a feedback unit for, when receiving FM broadcasts, filtering the output of the comparing unit, and for feeding the filtered output back to a low-pass filter of the phase-locked loop included in the video detecting unit.

Preferably, the reference signal applied to the second FM detecting unit is a signal obtained by frequency-multiplying a certain signal of a stable frequency by (n/m), where n and m are arbitrary natural numbers. The video intermediate-frequency signal processing device can comprise an (n/m) frequency multiplier for multiplying the stable frequency of the signal, which can be generated by an oscillator built in the tuner to control the tuner, by (n/m).

Further objects and advantages of the present invention will be apparent from the following description of the preferred embodiment of the invention as illustrated in the accompanying drawings.

DETAILED DESCRIPTION OF THE PREFERRED EMBODIMENT

Figure 1:
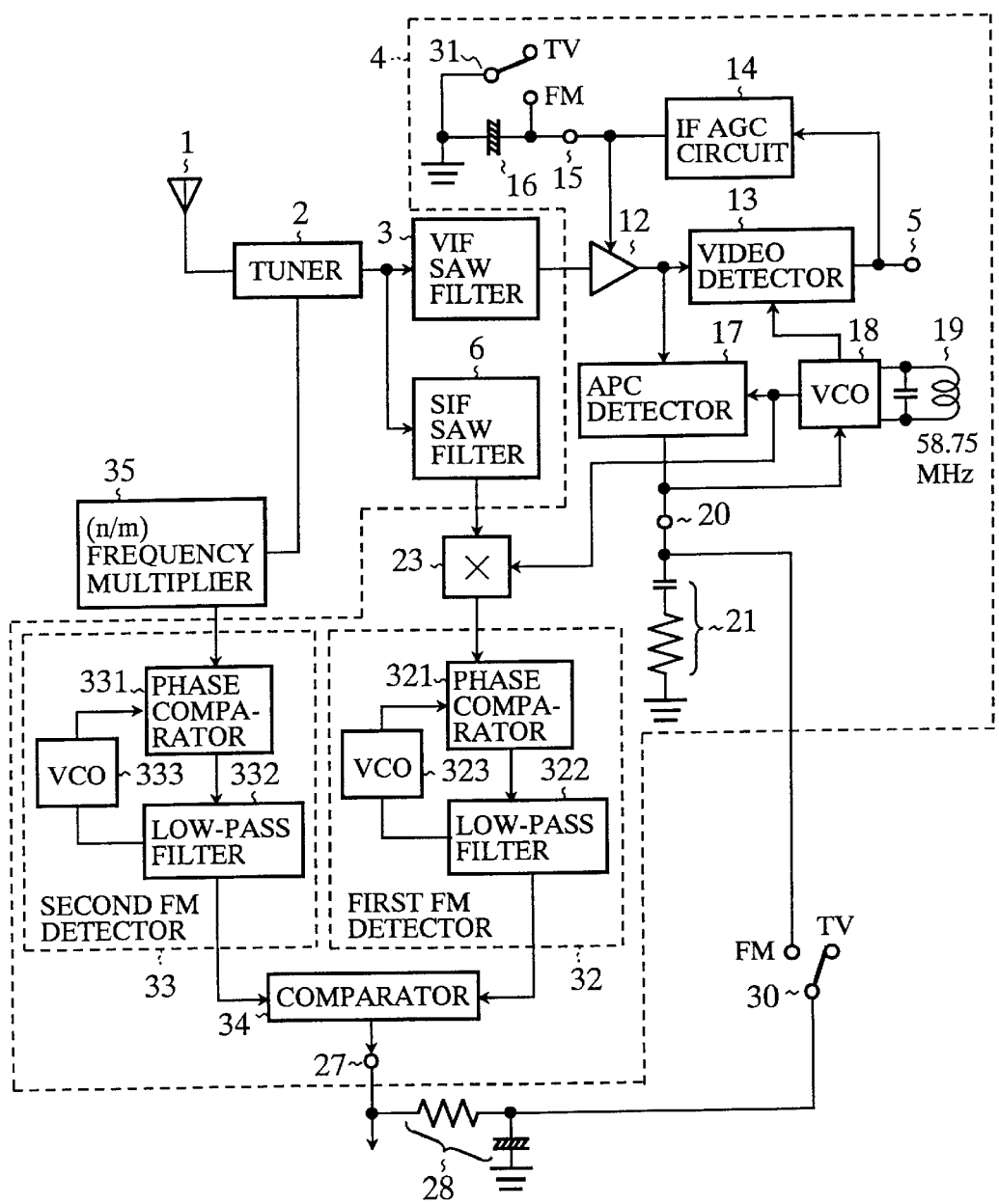
FIG. 1 is a block diagram showing the structure of a video intermediate-frequency signal processing device capable of receiving FM broadcasts according to an embodiment of the present invention.
Figure 2:
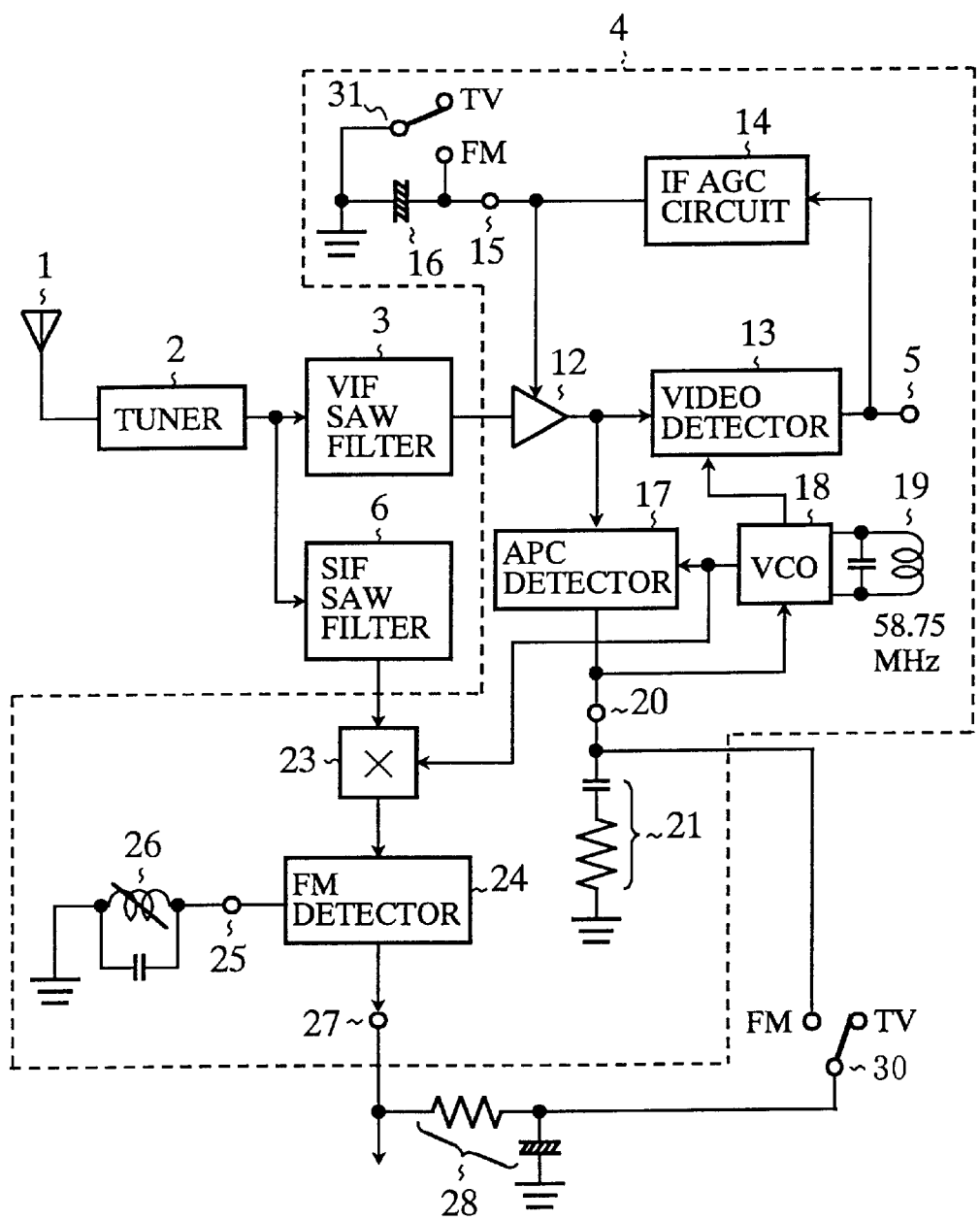
FIG. 2 is a block diagram showing the structure of an example of a prior art video intermediate-frequency signal processing device capable of receiving FM broadcasts.

Referring next to FIG. 1, there is illustrated a block diagram showing the structure of a video intermediate-frequency signal processing device capable of receiving FM broadcasts according to an embodiment of the present invention. In the figure, reference numeral 1 denotes an antenna for receiving broadcast waves, and 2 denotes a tuner which can select a desired broadcast wave from among the plurality of broadcast waves received via the antenna 1, and which, when receiving television broadcast waves, can convert a selected television broadcast signal into an intermediate-frequency signal including a video modulated component and a sound modulated component, and, when receiving FM broadcast waves, can convert a selected FM broadcast signal into an intermediate-frequency signal having the same frequency as the sound intermediate-frequency component to be generated when receiving television broadcast waves. Furthermore, reference numeral 3 denotes a VIF SAW filter for extracting a video intermediate-frequency component of a certain frequency, typically, 58.75 MHz, from the output of the tuner 2, 6 denotes an SIF SAW filter for extracting a sound intermediate-frequency component of a certain frequency, typically, 54.25 MHz, from the output of the tuner 2, and 4 denotes a video intermediate-frequency signal processing IC for detecting or demodulating the output of the VIF SAW filter 3. In addition, reference numeral 12 denotes a VIF amplifier for amplifying the output of the VIF SAW filter 3, 13 denotes a video detector for detecting or demodulating the output of the VIF amplifier 12, 14 denotes an IF AGC circuit for controlling the gain of the VIF amplifier 12 according to the output of the video detector 13, 15 denotes an IF AGC filter terminal for connecting an IF AGC filter 16 comprising of a capacitor to the IF AGC circuit 14, 31 denotes a switch which can be switched to a TV terminal to open the ends of the IF AGC filter 16 when receiving television broadcast waves, and which can be switched to an FM terminal to close both ends of the IF AGC filter 16 when receiving FM broadcast waves, and 17 denotes an APC detector for comparing the phase of an output signal from the VIF amplifier 12 and that of an output signal from a VCO 18 so as to furnish a signal indicating the phase difference between them to the VCO 18 and automatically control the phase operation of the VCO 18. The VCO 18 furnishes a control voltage of a certain frequency which is dependent on the output of the APC detector 17. In addition, reference numeral 19 denotes a VCO coil for setting the free-running frequency of the VCO 18 to 58.75 MHz, typically. The VCO coil 19 includes an inductance component and a capacitance component. Reference numeral 20 denotes an APC filter terminal for connecting an APC filter 21 to the APC detector 17. The APC filter 21 comprises a capacitor and a resistor. After the APC filter 21 filters the output of the APC detector 17, the output of the APC detector 17 is applied as a control input to the VCO 18.

Reference numeral 23 denotes an SIF detector for receiving both the output of the SIF SAW filter 6 and the output of the VCO 18, and for performing an SIF detection, 32 denotes a first FM detector which serves as an FM detector intended for sound demodulation to perform an FM detection on the output of the SIF detector 23, and 33 denotes a second FM detector for performing an FM detection on a reference signal applied thereto to generate a reference DC voltage. The first and second FM detectors 32 and 33 both comprise PLLs. The first FM detector 32 is provided with a phase comparator 321 connected to the SIF detector 23, a low-pass filter 322 that transmits only low-frequency components, below a given cutoff frequency, included in the output of the phase comparator 321, and a VCO 323 having a free-running frequency, typically, 4.5 MHz. The second FM detector 33 is provided with a phase comparator 331 connected to an (n/m) frequency multiplier 35, a low-pass filter 332 that transmits only low-frequency components, below a given cutoff frequency, included in the output of the phase comparator 331, and a VCO 333 having a free-running frequency of typically 4.5 MHz. The (n/m) frequency multiplier 35 multiplies the frequency of a signal which is generated by a local oscillator (not shown) built in the tuner 2 and is used for controlling the operation of the tuner 2, by (n/m), where n and m are arbitrary integers. The signal generated by the local oscillator built in the tuner 2 has a frequency of 4.0 MHz, typically. In this case, the (n/m) frequency multiplier 35 multiplies the frequency of the signal from the local oscillator by (9/8).

Furthermore, reference numeral 34 denotes a comparator for furnishing, as a detected sound output, a signal having a value corresponding to the difference between the output of the first FM detector 32 and the output of the second FM detector 33, 27 denotes an output terminal through which the detected sound output from the comparator 34 is furnished, 28 denotes a low-pass filter comprising a resistor and a capacitor, for extracting low-frequency components from the demodulated sound output from the comparator 34, and 30 denotes a switch which can be switched to a TV terminal so as to disconnect the output of the low-pass filter 28 from the APC filter terminal 20 when receiving television broadcast waves, and which can be switched to an FM terminal so as to connect the output of the low-pass filter 28 to the APC filter terminal 20 when receiving FM broadcast waves.

Next, a description will be given of the operation of the video intermediate-frequency signal processing device according to the embodiment of the present invention. When receiving a desired television broadcast, the video detector 13 demodulates the video intermediate-frequency signal which has been amplified by the VIF amplifier 12 so that the video intermediate-frequency signal has a certain amplitude. The video detector 13 then furnishes the demodulated video signal by way of the output terminal 5. Since the switch 31 does not short circuit the IF AGC filter 16, the IF AGC circuit 14 produces an AGC voltage from the demodulated video output of the video detector 13, and the IF AGC filter 16 then filters the AGC voltage from the IF AGC circuit 14. The filtered AGC voltage is applied to the VIF amplifier 12. Thus, the IF AGC loop is formed when receiving a desired television broadcast. The phase-locked loop or PLL comprising the APC detector 17, the APC filter 21, and the VCO 18 generates a reference carrier wave used for demodulating the video intermediate-frequency signal from the VIF SAW filter. The reference carrier wave furnished by the VCO 18 has the same frequency as the VIF carrier wave, and is in phase with the VIF carrier wave.

For a sound signal in the received television broadcast wave, the SIF detector 23 performs detection by multiplying the reference carrier wave from the VCO 18 by a sound intermediate-frequency signal extracted by the SIF SAW filter 6 (e.g. a sound signal at a frequency of 54.25 MHz in the case where the video intermediate-frequency signal processing device is destined for Japan), so as to convert the sound intermediate-frequency signal applied thereto into another sound intermediate-frequency signal a frequency of, typically, 4.5 MHz. After that, the comparator 34 demodulates the sound intermediate-frequency signal to produce a sound signal and then furnishes it by way of the output terminal 27. At that time, since the switch 30 is switched to the TV terminal, the demodulated sound signal filtered by the low-pass filter 28 does not reach the APC filter 21.

On the other hand, when receiving a desired FM broadcast, the switch 31 is switched to the FM terminal and short circuits the IF AGC filter 16. As a result, the gain of the VIF amplifier 12 is reduced to a minimum. Since the APC detector 17 does not output anything when the gain of the VIF amplifier 12 is set to its minimum, the VCO 18 oscillates freely while it is unaffected by the APC detector 17.

The SIF SAW filter 6 extracts an FM sound intermediate-frequency component at a frequency of, typically, 54.25 MHz from the output of the tuner 2 and then furnishes it to the SIF detector 23. The SIF detector 23 then performs detection by multiplying the reference carrier wave from the VCO 18 by the sound intermediate-frequency signal extracted by the SIF SAW filter 6 (e.g. a sound signal at a frequency of 54.25 MHz in the case where the video intermediate-frequency signal processing device is destined for Japan), so as to convert the sound intermediate-frequency signal applied thereto into another sound intermediate-frequency signal at a frequency, typically, 4.5 MHz. When the first FM detector 32 receives the sound intermediate-frequency signal from the SIF detector 23, the phase comparator 321 compares the phase of the sound intermediate-frequency signal with that of the output of the VCO 323 to furnish a signal indicating the phase difference. The output of the phase comparator 321 is filtered by the low-pass filter 322 and is then applied as a control input to the VCO 323. The filtered output is also furnished to the comparator 34. The first FM detector 32 thus demodulates the sound intermediate-frequency signal at a certain frequency, e.g., 4.5 MHz, applied thereto so as to generate a demodulated FM sound signal. On the other hand, when the second FM detector 33 receives the reference signal at a certain frequency, e.g., 4.5 MHz, from the (n/m) frequency multiplier 35, the phase comparator 331 compares the phase of the reference signal with that of the output of the VCO 333 to furnish a signal indicating the phase difference in a manner similar to the phase comparator 321. The output of the phase comparator 331 is filtered by the low-pass filter 332 and is then applied as a control input to the VCO 333. The filtered output is also furnished to the comparator 34. The second FM detector 33 thus detects or demodulates the reference signal from the (n/m) frequency multiplier 35 so as to generate a reference DC voltage.

The comparator 34 obtains the difference between the output signal from the first FM detector 32 and the output signal from the second FM detector 33 and then furnishes a DC voltage indicating the difference as a detected sound output by way of the output terminal 27. The DC voltage that appears at the output terminal 27 enters the low-pass filter 28, and the low-pass filter 28 rejects the sound signal from the DC voltage and then furnishes the filtered DC voltage to the APC filter terminal 20 by way of the switch 30, because the switch 30 is switched to the FM terminal as well when the video intermediate-frequency signal processing device receives FM broadcasts. If automatic fine tuning or AFT is carried out so that the polarity of the FM detection characteristic matches the polarity of AFT, the VCO 18 can be controlled and therefore the FM detection can be performed stably.

Thus, by using the same circuit as that used when demodulating a modulated sound signal included in a desired television broadcast wave, the video intermediate-frequency signal processing device of this embodiment can convert an FM broadcast signal into an intermediate-frequency signal at a frequency of 54.25 MHz by means of the tuner 2, further convert the intermediate-frequency signal into anther intermediate-frequency signal with a carrier frequency of 4.5 MHz by means of the SIF detector 23, and then produce an FM broadcast sound signal by means of the first and second FM detectors 32 and 33, and the comparator 34.

In a variant, instead of the signal generated by the local oscillator (not shown) built in the tuner 2, any signal having stable frequency such as a clock signal at a certain frequency, e.g., 3.58 MHz, from a crystal oscillator, which is used for processing color signals when receiving TV broadcasts, can be used as the signal applied to the (n/m) frequency multiplier 35. The (n/m) frequency multiplier 35 is not limited to such a clock signal. Furthermore, it is clear from the above description that an oscillator such as a crystal oscillator that oscillates at a frequency of 4.5 MHz can be used as a substitute for the (n/m) frequency multiplier 35.

As previously mentioned, in accordance with the present invention, there is provided a low-cost video intermediate-frequency signal processing device capable of receiving FM broadcasts without having to use an FM detection coil and a terminal for connecting the coil to the FM detector which prior art video intermediate-frequency signal processing devices require, and, hence, without having to adjust the FM detection coil at the time of manufacture. In addition, since the video intermediate-frequency signal processing device can generate a reference signal to be applied to the second FM detector by multiplying the frequency of the output of an oscillator built in the tuner 2 or the like, the cost of manufacturing the video intermediate-frequency signal processing device can be brought in line.

Many widely different embodiments of the present invention may be constructed without departing from the spirit and scope of the present invention. It should be understood that the present invention is not limited to the specific embodiment described in the specification, except as defined in the appended claims.

What is claimed is:

1. A video intermediate-frequency signal processing device comprising:

tuning means for selecting a desired FM or TV broadcast wave from among FM and TV broadcast waves, for, when receiving TV broadcasts, converting a selected television broadcast signal into an intermediate-frequency signal including a video component having a first frequency and a sound component having a second frequency, and, when receiving FM broadcasts, converting a selected FM broadcast signal into a first intermediate-frequency signal having the second frequency and for furnishing the intermediate-frequency signal;

first extracting means for extracting a video intermediate-frequency signal associated with the selected TV broadcast wave from said tuning means;

second extracting means for extracting either a sound intermediate-frequency signal associated with the selected TV broadcast wave or an intermediate-frequency signal associated with the selected FM broadcast wave from said tuning means;

video detecting means for demodulating the video intermediate-frequency signal extracted by said first extracting means and having a phase-locked loop including a voltage-controlled oscillator that can oscillate freely at the first frequency;

sound intermediate-frequency detecting means for converting the sound intermediate-frequency signal associated with the selected TV broadcast wave or the intermediate-frequency signal associated with the selected FM broadcast wave, extracted by said second extracting means, into a second intermediate-frequency signal at a lower frequency using an output of said voltage-controlled oscillator;

first FM detecting means for demodulating the second intermediate-frequency signal from said sound intermediate-frequency detecting means using a phase-locked loop, and for furnishing a demodulated FM signal;

second FM detecting means for detecting a reference signal applied to generate a reference DC voltage;

comparing means for obtaining a difference between the modulated FM signal from said first FM detecting means and the reference DC voltage from said second FM detecting means, and for furnishing, as a sound signal, a signal corresponding to the difference; and feedback means for, when receiving FM broadcasts, filtering the sound signal from said comparing means to produce a filtered output, and for feeding the filtered output back to a low-pass filter of said phase-locked loop included in said video detecting means.

2. The video intermediate-frequency signal processing device according to claim 1, wherein the reference signal applied to said second FM detecting means is obtained by frequency-multiplying a stable frequency by (n/m), where n and m are arbitrary integers.

3. The video intermediate-frequency signal processing device according to claim 2, comprising an (n/m) frequency multiplier for multiplying the stable frequency, be generated by an oscillator built in said tuning means to control said tuner means, by (n/m).

* * * * *